(12) United States Patent
Ahn et al.

(10) Patent No.: US 7,956,534 B2
(45) Date of Patent: Jun. 7, 2011

(54) LIGHT EMITTING DEVICE

(75) Inventors: Tae Joon Ahn, Seoul (KR); Hong Koo Lee, Incheon (KR)

(73) Assignee: LG Display Co., Ltd., Seoul (KR)

( * ) Notice: Subject to any disclaimer, the term of this patent is extended or adjusted under 35 U.S.C. 154(b) by 467 days.

(21) Appl. No.: 11/451,031

(22) Filed: Jun. 12, 2006

(65) Prior Publication Data
US 2007/0132364 A1  Jun. 14, 2007

(30) Foreign Application Priority Data
Dec. 12, 2005  (KR) .................. 10-2005-0122054

(51) Int. Cl.
H01L 51/52 (2006.01)
(52) U.S. Cl. .......................... 313/506; 445/24
(58) Field of Classification Search ............. 445/24; 313/498, 506
See application file for complete search history.

(56) References Cited

U.S. PATENT DOCUMENTS

| 2004/0014251 | A1* | 1/2004 | Park et al. ............. 438/22 |
| 2004/0080262 | A1* | 4/2004 | Park et al. ............. 313/498 |
| 2004/0207322 | A1* | 10/2004 | Okuyama et al. ........ 313/512 |
| 2004/0227459 | A1* | 11/2004 | Imura ................... 313/504 |
| 2005/0001963 | A1* | 1/2005 | Yokoyama ............. 349/122 |
| 2005/0040754 | A1* | 2/2005 | Sakurai ................ 313/500 |
| 2005/0095409 | A1 | 5/2005 | Koeda et al. |
| 2007/0029929 | A1* | 2/2007 | Nakamura et al. ....... 313/506 |

FOREIGN PATENT DOCUMENTS

| CN | 1477913 | 2/2004 |
| CN | 1499909 | 5/2004 |
| JP | 11-8065 A | 1/2005 |
| JP | 2005-93335 A | 4/2005 |
| JP | 2005-114916 A | 4/2005 |

OTHER PUBLICATIONS

Machine Translation of Okuyama (JP 2005093335 A).*
Office Action issued in corresponding Chinese Patent Application No. 200610087958.4; mailed Jul. 11, 2008.
Office Action issued in corresponding German Patent Application No. 10 2006 026 225.5; issued Oct. 24, 2008.
Office Action issued in corresponding Japanese Office Action 2006-162664; issued Jul. 21, 2009.

* cited by examiner

*Primary Examiner* — Joseph L Williams
*Assistant Examiner* — Andrew J Coughlin
(74) *Attorney, Agent, or Firm* — Brinks Hofer Gilson & Lione

(57) ABSTRACT

A light emitting device comprises a first pixel portion that includes a light emitting portion arranged between two electrodes on a first substrate, a transistor portion formed on a second substrate arranged to be opposed to the first substrate, a connection electrode extended from one of the two electrodes, and an electrical contact portion in surface contact with both the connection electrode and a drain of the transistor portion.

6 Claims, 8 Drawing Sheets

LIGHT EMITTING DEVICE

The present application claims the benefit of Korean Patent Application No. 10-2005-0122054 filed in Korea on Dec. 12, 2005, which is hereby incorporated by reference.

FIELD

The present invention relates to a light emitting device and a manufacturing method thereof.

RELATED ART

A light emitting device is a self-emitting device comprising a light emitting portion arranged between its two electrodes.

The light emitting device may be classified into a passive matrix type and an active matrix type in accordance with its driving method, wherein the active matrix type is driven by using a transistor portion (TFT).

The light emitting device may also be classified into a top emission type and a bottom emission type in accordance with its light emitting direction.

Hereinafter, a structure of a prior light emitting device will be described with reference to the accompanying drawings.

FIG. 1 is a sectional view of a prior light emitting device and an enlarged sectional view of a main portion thereof.

Referring to FIG. 1, on a first substrate 10 is formed an anode electrode 12, for example, made of indium-tin-oxide (ITO).

On the anode electrode are formed a barrier rib insulating layer 13 and a barrier rib 'I' for defining a light emitting region.

On a partial region of the anode electrode 12 defined by the barrier rib 'I' is formed a connection electrode insulating layer 14, on which is formed a spacer 'S' whose height is higher than the height of the barrier rib 'I'.

There are also deposited a light emitting portion 16, for example, comprising an organic light emitting layer, and a cathode electrode 18.

Accordingly, there is formed a pixel portion 'P' comprising the anode electrode 12, the light emitting portion 16, and the cathode electrode 18.

There is formed a connection electrode 'C' comprising the connection electrode insulating layer 14, the spacer 'S', and a conductive layer electrically connected with the cathode electrode 18.

The conductive layer may be formed of the same conductive material as the cathode electrode 18.

A second substrate 30, arranged to be opposed to the first substrate 10 is patterned with a semiconductor layer formed of an amorphous silicon or polycrystalline silicon, and impurities are added to a part of the semiconductor layer, thus forming an active layer 32a, a source 32b, and a drain 32c, respectively.

On the aforementioned semiconductor layer is formed a gate insulating film 34 exposing a part of the source 32b and drain 32c, and on a region corresponded to the active layer 32a of the gate insulating film 34, is formed a gate electrode 32d, thus forming a transistor portion 32.

In addition, on the transistor portion 32 is formed a between-layer insulating film 36 exposing a part of the source 32b and drain 32c, and there are formed a source electrode 38a and drain electrode 38b, electrically connected with the source 32b and drain 32c, respectively.

There is also formed a division insulating film 39 for dividing neighboring transistor portions 32, and exposing a part 'A1' of the drain electrode 38b to contact the connection electrode 'C'.

The first and second substrates 10 and 30 are arranged such that the connection electrode 'C' is brought in contact with the exposed part 'A1' of the drain electrode 38b, and then sealed and attached to each other.

The above mentioned prior light emitting device has a severe problem caused by its connection electrode structure.

Specifically, upon forming the spacer 'S' constituting the connection electrode 'C', a process error gives rise to size difference between each connection electrode 'C'. Accordingly, when the first substrate 10 and second substrate 30 are attached to each other, some connection electrodes 'C' cause loose connection.

Moreover, it is not facilitated to exert a constant physical power on the entire substrate in the attachment process of the substrate, and the stress is concentrated only on a part of the substrate. Accordingly, the spacer formed on that part of the substrate get to be deformed, and its part is floated up relatively, thus causing loose contact of the connection electrode 'C'.

The spacer's deformation due to heat generated upon driving the device also leads to loose contact portion of the connection electrode.

When this device is applied as a light emitting device, this loose contact gives rise to severe problems such as causing dead points, and poor brightness, which may result in stains or smudges on the device.

Therefore, there occurs a problem such as lowering of process throughput, product lifespan, and reliability.

SUMMARY

A light emitting device comprises a first pixel portion that includes a light emitting portion arranged between two electrodes on a first substrate. The light emitting device further comprises a transistor portion formed on a second substrate arranged to be opposed to the first substrate, a connection electrode extended from one of the two electrodes, and an electrical contact portion in surface contact with both the connection electrode and a drain of the transistor portion.

According to another aspect of the present invention, a light emitting device comprises a first pixel portion that includes a light emitting portion arranged between two electrodes on a first substrate. The light emitting device further comprises a transistor portion formed on a second substrate arranged to be opposed to the first, a connection electrode extended from a drain of the transistor portion, and an electrical contact portion in surface contact with either of the two electrodes and the connection electrode.

According to still another aspect of the present invention, a light emitting device comprises a first pixel portion that includes a light emitting portion arranged between two electrodes on a first substrate. The light emitting device further comprises a transistor portion formed on a second substrate arranged to be opposed to the first substrate, a first connection electrode extended from either of the two electrodes, a second connection electrode extended from a drain of the transistor portion, and an electrical contact portion in surface contact with both the first connection electrode and the second connection electrode.

According to still another aspect of the present invention, a method of manufacturing a light emitting device comprises forming a first pixel portion that includes a light emitting portion arranged between two electrodes on a first substrate, and forming a transistor portion on a second substrate. The method of manufacturing a light emitting device further comprises forming a connection electrode extended from either of the two electrodes and forming an electrical contact portion in surface contact with both the connection electrode and a drain of the transistor portion.

According to still another aspect of the present invention, a method of manufacturing a light emitting device comprises forming a first pixel portion that includes a light emitting portion arranged between two electrodes on a first substrate. The method of manufacturing a light emitting device further comprises forming a transistor portion on a second substrate, forming a connection electrode extended from a drain of the transistor portion, and forming an electrical contact portion in surface contact with either of the two electrodes and the connection electrode.

According to still another aspect of the present invention, a method of manufacturing a light emitting device comprises forming a first pixel portion that includes a light emitting portion arranged between two electrodes on a first substrate. The method of manufacturing a light emitting device further comprises forming a transistor portion on a second substrate, forming a first connection electrode extended from either of the two electrodes, forming a second connection electrode electrically extended from a drain of the transistor portion, and forming an electrical contact portion in surface contact with both the first connection electrode and the second connection electrode.

BRIEF DESCRIPTION OF THE DRAWINGS

The invention will be described in detail with reference to the following drawings in which like numerals refer to like elements.

DETAILED DESCRIPTION

Preferred embodiments of the present invention will be described in a more detailed manner with reference to the drawings.

Figure 2:
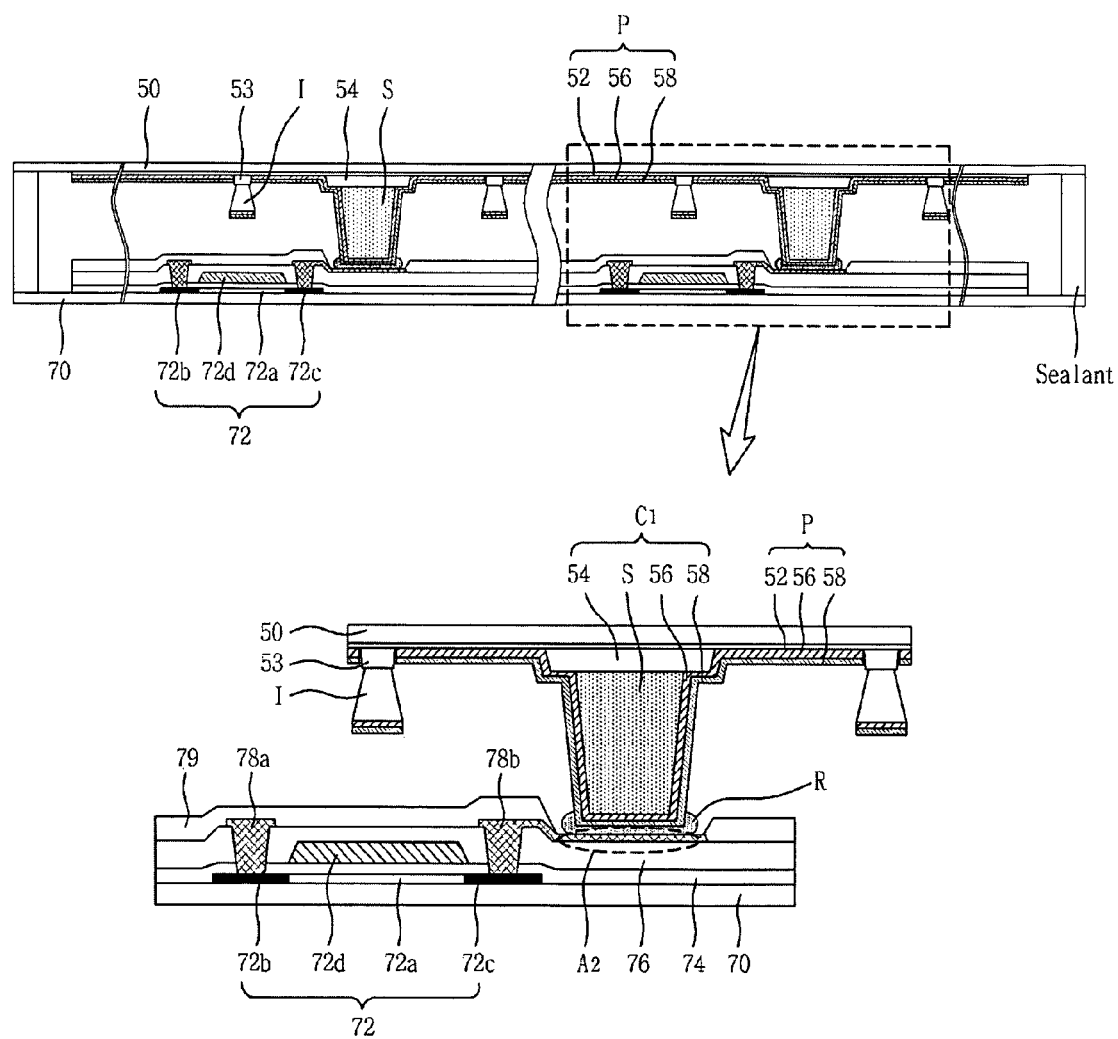
FIG. 2 is a sectional view of a light emitting device and an enlarged view of a main part thereof in accordance with a first embodiment of the present invention.

FIG. 2 is a sectional view of a light emitting device and an enlarged view of a main part thereof according to a first embodiment of the present invention.

Referring to FIG. 2, on a first substrate 50 is formed a first electrode 52, for example, made of indium-tin-oxide (ITO).

On the first electrode 52 are formed a barrier rib insulating layer 53 and a barrier rib 'I' for defining a light emitting region.

On a partial region of the first electrode 52 defined by the barrier rib 'I' is a connection electrode insulating layer 54, on which is formed a spacer 'S' whose height is higher than the height of the barrier rib 'I'.

There are also deposited a light emitting portion 56, for example, comprising an organic light emitting layer, and a second electrode 58.

Accordingly, there is formed a pixel portion 'P' comprising the first electrode 52, the light emitting portion 56, and the second electrode 58.

There is formed a connection electrode 'C1' comprising the connection electrode insulating layer 54, the spacer 'S', and a conductive layer electrically connected with the second electrode 58.

The conductive layer may be formed of the same conductive material as the second electrode 58.

A second substrate 70, arranged to be opposed to the first substrate 50, is patterned with a semiconductor layer formed of an amorphous silicon or polycrystalline silicon, and impurities are added to a part of the semiconductor layer, thus forming an active layer 72a, a source 72b, and a drain 72c, respectively.

On the aforementioned semiconductor layer is formed a gate insulating film 74 thus exposing each part of the source 72b and drain 72c.

And on a region, corresponding to the active layer 72a of the gate insulating film 74, is formed a gate electrode 72d, thus forming a transistor portion 72.

On the transistor portion 72 is formed a between-layer insulating film 76 for exposing each part of the source 72b and drain 72c.

And there are formed a source electrode 78a and a drain electrode 78b electrically connected with the source 72b and the drain 72c, respectively.

There is also formed a division insulating film 79 for dividing neighboring transistor portions 72 and exposing a part 'A2' of the drain electrode 78b to be connected electrically with the connection electrode 'C1'.

The first and second substrates 50 and 70 are arranged such that the connection electrode 'C1' is brought in being connected electrically with the exposed part 'A2' of the drain electrode 78b, and then sealed and attached to each other by a sealant.

In a given region A2, between the connection electrode 'C1' and drain electrode 78b, is formed a paste-type electrical contact portion 'R' having conductivity, viscosity, and thermal resistance, whose main base material comprises Ag, Cu, or Au, thus improving efficiently the electrical connection state between the connection electrode 'C1' and drain electrode 78b.

Specifically, the connection structures C1, A2, R of the light emitting device applied with the electrical contact portion 'R' in accordance with the first embodiment of the present invention can solve the problem of loose contact between the connection electrode 'C1' and drain electrode 78b arisen by height difference of the connection electrode 'C1' due to errors upon a forming process.

The problem of loose contact arisen by floating between the connection electrode 'C1' and drain electrode 78b due to stress concentration arisen on a part of substrates 50 and 70 in the middle of attaching the substrates 50 and 70 can also be solved.

The problem of loose contact between the connection electrode 'C1' and drain electrode 78b arisen by the deformation of the connection electrode 'C1' due to heat generated upon driving the device can also be solved.

The metal used as the main base material of the electrical contact portion 'R' described in the first embodiment of the present invention is not limited to Ag, Cu, or Au.

For example, the electrical contact portion 'R' may employ an alloy of at least two of Ag, Cu, or Au.

Figure 3:
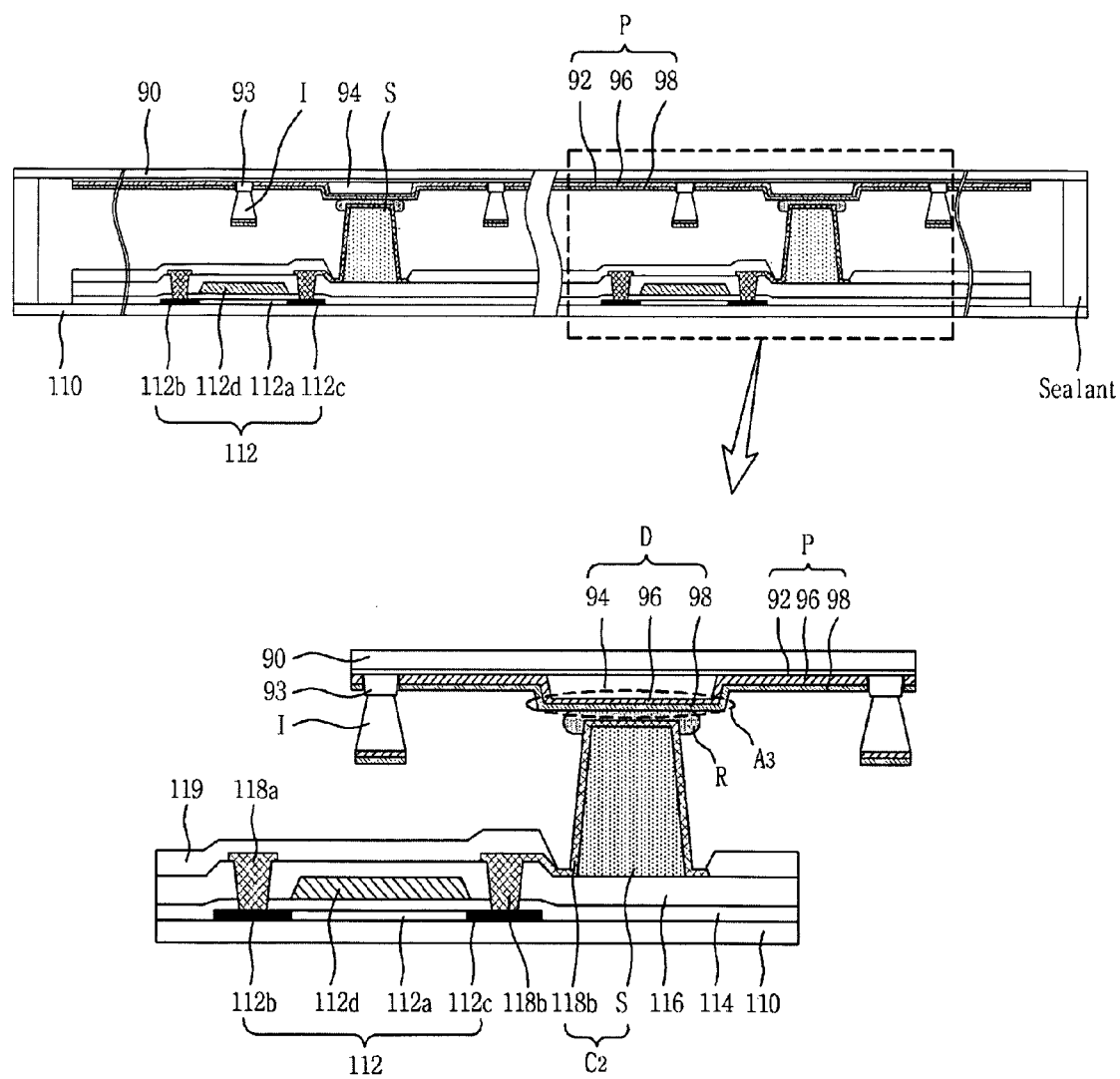
FIG. 3 is a sectional view of a light emitting device and an enlarged view of a main part thereof in accordance with a second embodiment of the present invention.

FIG. 3 is a sectional view of a light emitting device and an enlarged view of a main part thereof in accordance with a second embodiment of the present invention.

Referring to FIG. 3, on a first substrate 90 is formed a first electrode 92, for example, made of indium-tin-oxide (ITO).

In addition, on the first electrode 92 are formed a barrier rib insulating layer 93 and a barrier rib 'I' for defining a light emitting region.

In addition, a connection portion insulating layer 93 is formed on a part of the first electrode 92, patterned by the barrier rib 'I'.

There are also deposited a light emitting portion 96, for example, comprising an organic light emitting layer, and a second electrode 98.

Accordingly, there is formed a pixel portion 'P' comprising the first electrode 92, the light emitting portion 96, and the second electrode 98.

In addition, there is formed a connection portion 'D' comprising the connection portion insulating layer 94 and a conductive layer electrically connected with the second electrode 98.

The conductive layer may be formed of the same conductive material as the second electrode 98.

A second substrate 110, arranged to be opposed to the first substrate 90, is patterned with a semiconductor layer formed of an amorphous silicon or polycrystalline silicon, and impurities are added to a part of the semiconductor layer, thus forming an active layer 112a, a source 112b, and a drain 112c, respectively.

On the aforementioned semiconductor layer is formed a gate insulating film 114 for exposing each part of the source 112b and drain 112c, and on a region corresponded to the active layer 112a of the gate insulating film 114 is formed a gate electrode 112d, thus forming a transistor portion 112.

On the transistor portion 112 is formed a between-layer insulating film 116 for exposing each part of the source 112b and drain 112c, and on a part of the between-layer insulating film 116 adjacent to the drain 112c is formed a spacer 'S' whose height is higher than the height of at least the barrier rib 'I' of the first substrate 90.

There are also formed a source electrode 118a and a drain electrode 118b electrically connected with the source 112b and the drain 112c, respectively. Accordingly, there is formed a connection electrode 'C2' comprising the spacer 'S' and a conductive layer electrically connected with the drain electrode 118b.

There is also formed a division insulating film 119 for dividing neighboring transistor portions 112 and exposing a part of the connection electrode C2.

The first and second substrates 90 and 110 are arranged such that the connection electrode 'C2' is brought in being connected electrically with the connection portion 'D' and then sealed and attached to each other by a sealant.

At this time, in a given region A3 between the connection electrode 'C2' and connection portion 'D' is formed a paste-type electrical contact portion 'R' having conductivity, viscosity, and thermal resistance, whose main base material comprises Ag, Cu, or Au, improving efficiently the electrical connection state between the connection electrode 'C2' and connection portion 'D'.

Specifically, the connection structure C2, D, R of the light emitting device applied with the electrical contact portion 'R' in accordance with the second embodiment of the present invention can solve the problem of loose contact between the connection electrode 'C2' and connection portion 'D' arisen by height difference of the connection electrode 'C2' due to errors upon a forming process.

The problem with the loose contact portion arisen by floating between the connection electrode 'C2' and connection portion 'D' due to stress concentration on a part of substrates 90 and 110 in the middle of attaching the substrates 90 and 110 can also be solved.

The problem of loose contact between the connection electrode 'C2' and connection portion 'D' arisen by the deformation of the connection electrode 'C2' due to heat generated upon driving the device can also be solved.

The metal used as the main base material of the electrical contact portion 'R' described in the second embodiment of the present invention is not limited to Ag, Cu, or Au.

For example, the electrical contact portion 'R' may employ an alloy of at least two of Ag, Cu, or Au.

Figure 4:
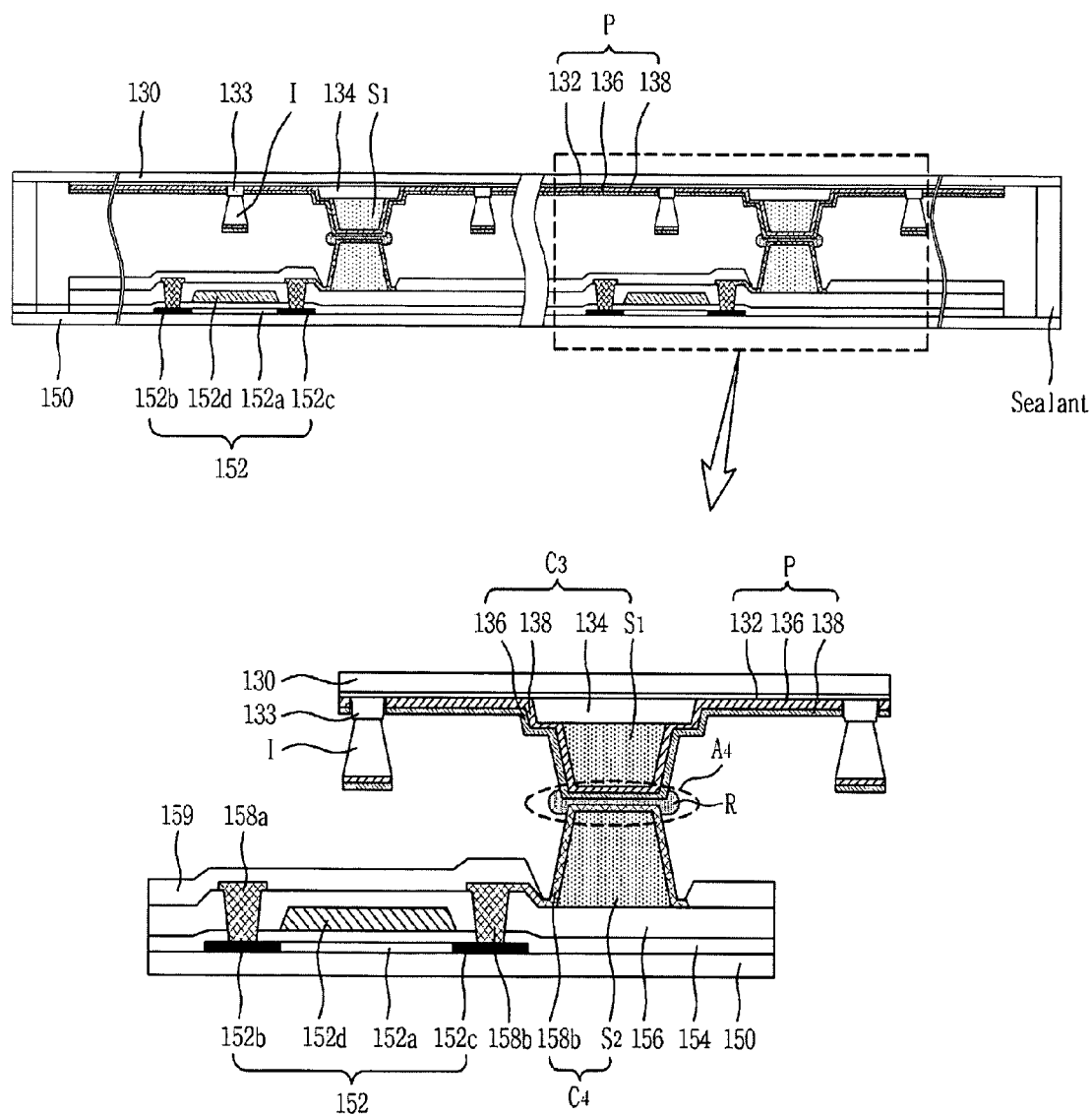
FIG. 4 is a sectional view of a light emitting device and an enlarged view of a main part thereof in accordance with a third embodiment of the present invention.

FIG. 4 is a sectional view of a light emitting device and an enlarged view of a main part thereof according to a third embodiment of the present invention.

Referring to FIG. 4, on a first substrate 130 is formed a first electrode 132, for example, made of indium-tin-oxide (ITO).

On the first electrode 132 are formed a barrier rib insulating layer 133 and a barrier rib 'I' for defining a light emitting region.

On a partial region of the first electrode 132 defined by the barrier rib 'I' is a connection electrode insulating layer 134, on which is formed a first spacer 'S1'.

There are also deposited a light emitting portion 136, for example, comprising an organic light emitting layer, and a second electrode 138.

Accordingly, there is formed a pixel portion 'P' comprising the first electrode 132, the light emitting portion 136, and the second electrode 138.

In addition, there is formed a first connection electrode 'C3' comprising the connection electrode insulating layer 134, the first spacer 'S1', and a conductive layer electrically connected with the second electrode 138.

The conductive layer may be formed of the same conductive material as the second electrode 138.

On a second substrate 150, arranged to be opposed to the first substrate 130, is patterned with a semiconductor layer formed of an amorphous silicon or polycrystalline silicon, and impurities are added to a part of the semiconductor layer, thus defining an active layer 152a, a source 152b, and a drain 152c, respectively.

On the aforementioned semiconductor layer is formed a gate insulating film 154 for exposing each part of the source 152b and the drain 152c, and on a region corresponding to the active layer 152a of the gate insulating film 154 is formed a gate electrode 152d, thus forming a transistor portion 152.

On the transistor portion 152 is formed a between-layer insulating film 156 for exposing each part of the source 152b and the drain 152c, and on a part of the between-layer insulating film 156 adjacent to the drain 152c is formed a second spacer 'S2'.

Sum of heights of the first and second spacers S1 and S2 should be at least higher than the height of the barrier rib 'I' of the first substrate 130.

There are also formed a source electrode 158a and a drain electrode 158b electrically connected with the source 152b and the drain 152c, respectively. Accordingly, there is formed a second connection electrode C4 comprising the second spacer 'S2' and a conductive layer electrically connected with the drain electrode 158b.

The conductive layer may be formed of the same material as the drain electrode 158b.

There is also formed a division insulating film 159 for dividing neighboring transistor portions 152 and exposing a part of the second connection electrode C4.

The first and second substrates 130 and 150 are arranged such that the first connection electrode 'C3' is brought in being connected electrically with the connection electrode 'C4' and then sealed and attached to each other by a sealant.

In a given region A4 between the first connection electrode 'C3' and second connection electrode 'C4' is formed a paste-type electrical contact portion 'R' having conductivity, viscosity, and thermal resistance, whose main base material comprises Ag, Cu, or Au, improving efficiently the electrical connection state between the first connection electrode 'C3' and second connection electrode C4.

Specifically, the connection structure C3, C4, R of the light emitting device applied with the electrical contact portion 'R' in accordance with the third embodiment of the present invention can solve the problem of loose contact between the first connection electrode 'C3' and second connection electrode 'C4' arisen by height difference of the first or second connection electrode C3, C4 due to errors upon a forming process.

The problem with the loose contact portion arisen by floating between the first connection electrode 'C3' and second connection electrode 'C4' due to stress concentration on a part of substrates 130 and 150 in the middle of attaching the substrates 130 and 150 can also be solved.

The problem of loose contact between the first connection electrode 'C3' and second connection electrode 'C4' arisen by the deformation of the first or second connection electrode C3, C4 due to heat generated upon driving the device can also be solved.

The metal used as the main base material of the electrical contact portion 'R' described in the third embodiment of the present invention is not limited to Ag, Cu, or Au.

For example, the electrical contact portion 'R' may employ an alloy of at least two of Ag, Cu, or Au.

Hereinafter, a process comprising each step for manufacturing the light emitting device according to the first embodiment of the present invention will be described with reference to FIGS. 5 through 11.

FIGS. 6 through 11 are illustrated in the same scale as the main portion shown in FIG. 2.

Figure 5:
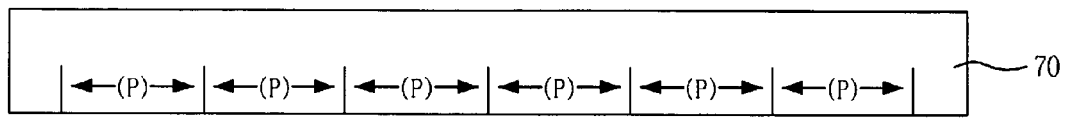
FIGS. 5 through 7 are partly sectional views for illustrating each step of a process for manufacturing a second substrate of a light emitting device in accordance with a first embodiment of the present invention.
Figure 5:
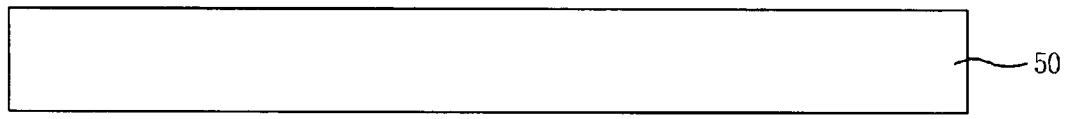
Figure 6:
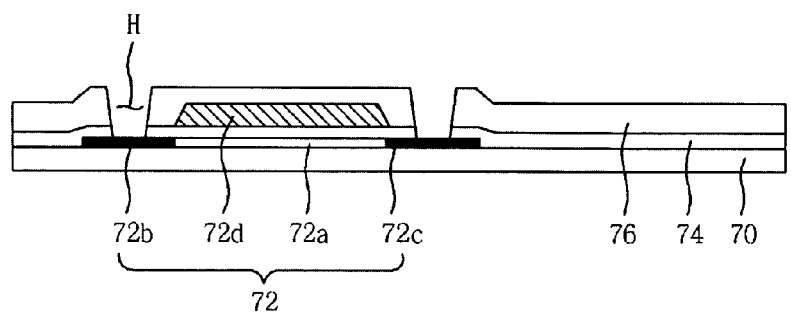
Figure 7:
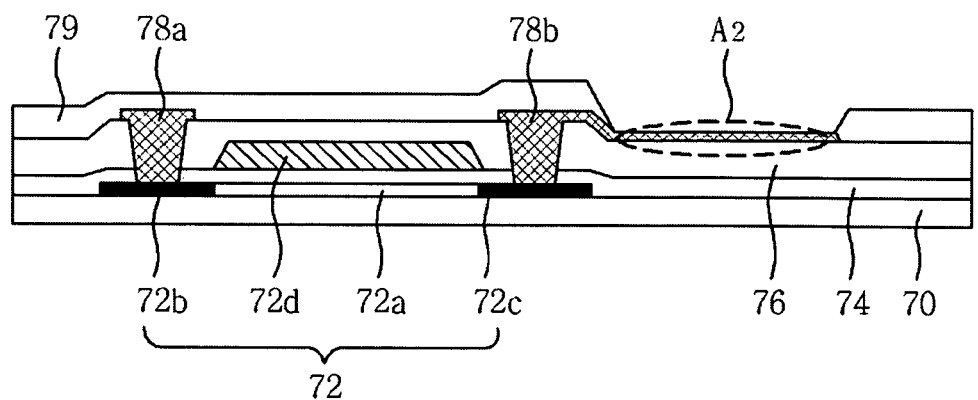

FIGS. 5 through 7 are partly sectional views for illustrating each step of a process for manufacturing a second substrate of a light emitting device in accordance with a first embodiment of the present invention.

Referring to FIG. 5, which illustrates the step of patterning substrates, a number of pixel portions P are formed on a first substrate 50, and a transistor portion (comprising a switching element and a driving element electrically connected with the switching element) is prepared on a second substrate 70 arranged to be opposed to the first substrate 50 to have electric field corresponding to the pixel portions P.

The first and second substrates 50 and 70 employ a transparent material.

Referring to FIG. 6, which illustrates the step of forming a driving portion, the transistor portion is formed on the second substrate 70 to correspond to the pixel regions 'P' defined on the first substrate 50.

Specifically, on the second substrate 70 is formed a buffer layer of any one selected from silicon insulating material groups comprising SiNx and $SiO_2$.

Amorphous silicon (a-Si) is deposited on the formed buffer layer, and then undergoes a dehydrogenation process and a crystallization process by heat, thus forming a polycrystalline silicon active layer. According to the patterned polycrystalline silicon active layer leaves an active layer 72a.

Then, injecting impurities into both sides of the active layer 72a and performing heat treatment on it form a source 72b and a drain 72c, and forming a gate insulating film 74 on the active layer 72a, the source 72b, and the drain 72c.

Subsequently, a gate electrode 72d is formed on a partial region corresponding to the active layer 72a of the gate insulating film 74. On the gate insulating film 74 and gate electrode 72d is formed a between-layer insulating film 76, and then contact holes H are formed to expose each part of the source 72b and the drain 72c, respectively.

Referring to FIG. 7, which illustrates the step of forming a connection electrode contact portion, a source electrode 78a and a drain electrode 78b are formed such that the source 72b and drain 72c, respectively, are exposed through the contact portion holes H.

And the drain electrode 78b is extended to a given region on the between-layer insulating film 76 such that a contact portion region A2, electrically connected with the connection electrode C1, is formed.

On the between-layer insulating film 76, on the source and drain electrodes 78a, 78b is optionally formed a division insulating film 79 to divide the neighboring transistor portions 72, and to expose the contact region A2.

Hereinafter, each step of a process for manufacturing the first substrate 50, which corresponds to the second substrate 70 and comprises a light emitting portion, will be described.

Figure 1:
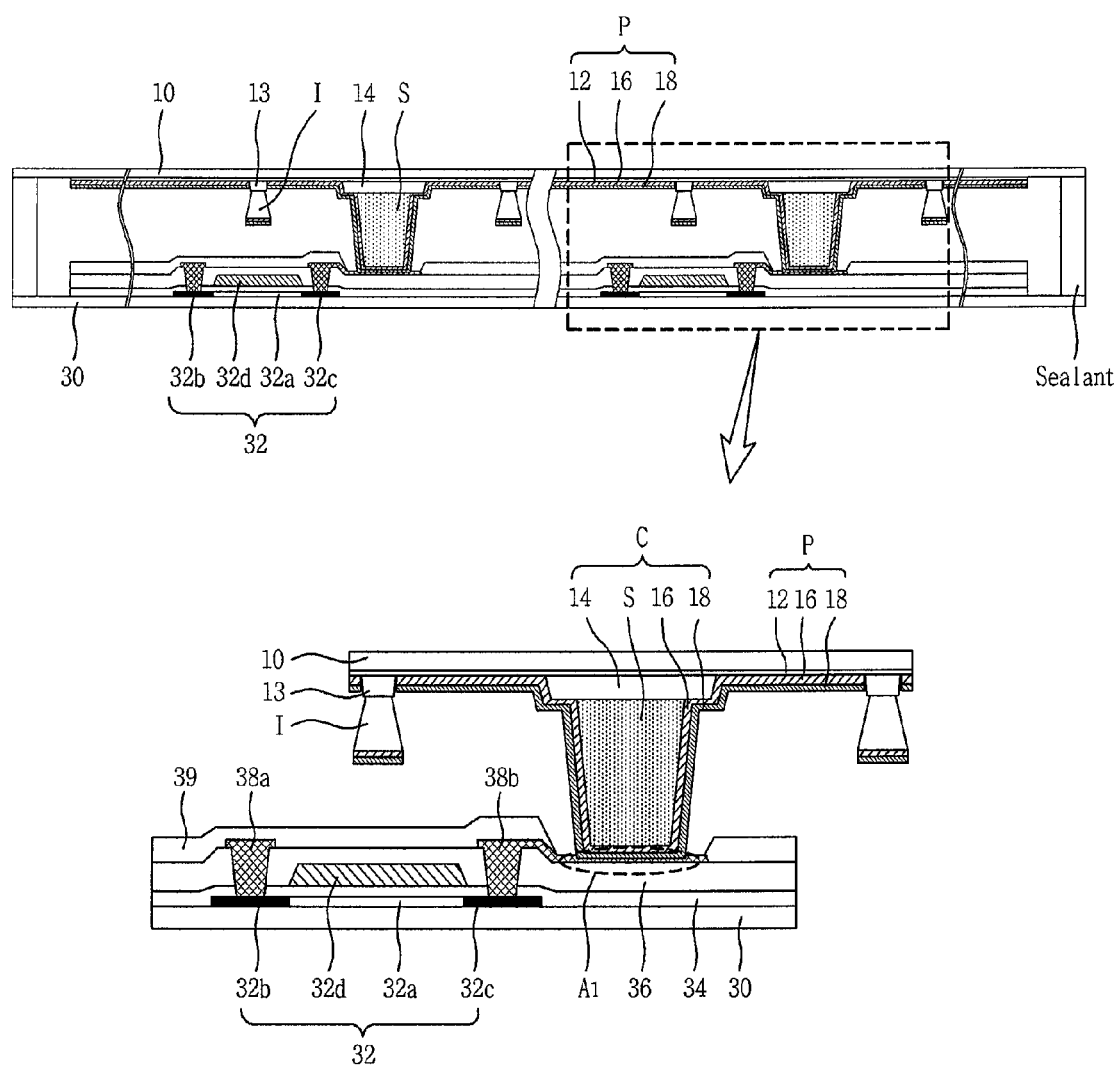
FIG. 1 is a sectional view of a prior light emitting device and an enlarged sectional view of a main portion thereof.
Figure 8:
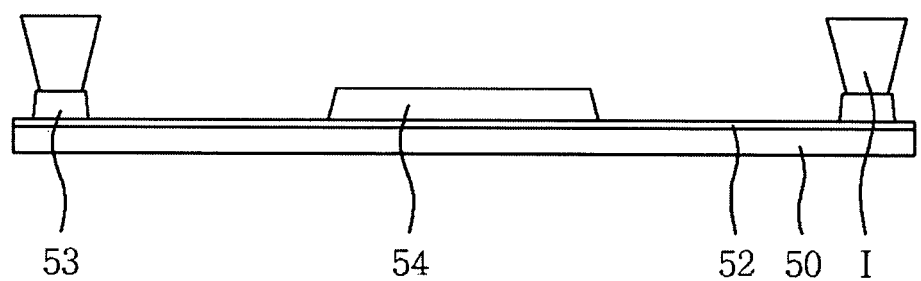
FIGS. 8 through 11 are partly sectional views for illustrating each step of a process for manufacturing a first substrate of a light emitting device in accordance with a first embodiment of the present invention.

FIGS. 8 through 1 are partly sectional views for illustrating each step of a process for manufacturing a second substrate of a light emitting device in accordance with a first embodiment of the present invention.

Referring to FIG. 8, which illustrates the step of patterning pixel portions, a first electrode 52 is optionally formed on a first substrate 50, and barrier rib insulating layers 53 are formed such that the pixel portions P defined as in FIG. 5 may be formed on the first electrode 52.

In addition, a connection electrode insulating layer 54 is formed such that a connection electrode may be formed at a given distance apart from the barrier rib insulating layers 53. Subsequently, barrier ribs 'I' are formed on the barrier rib insulating layers 53.

Figure 9:
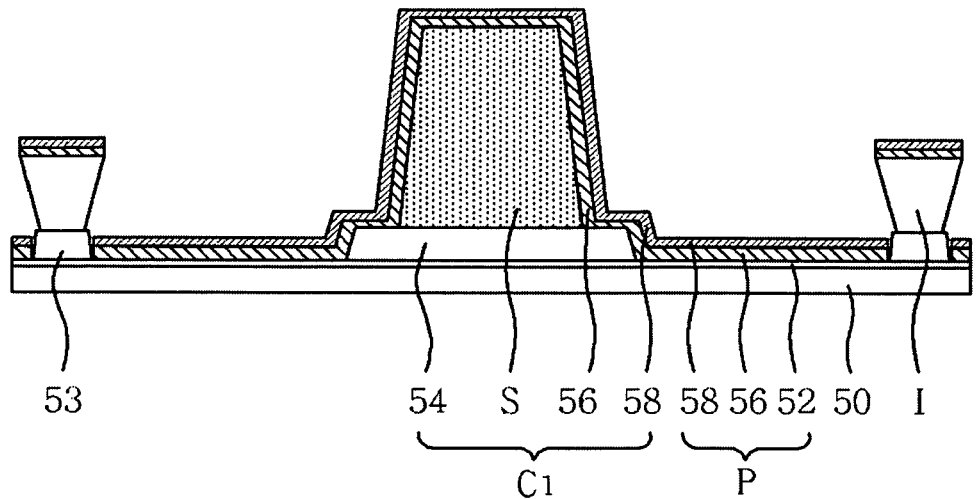

Referring to FIG. 9, which illustrates the step of forming a connection electrode, a spacer 'S' whose height is higher than the height of the barrier ribs 'I' is formed on the connection electrode insulating layers 53.

Then, there is formed a light emitting portion 56 comprising one or more electric charge injection/transport layers and light emitting layers, and on the light emitting portion 56 is formed a second electrode 58.

Accordingly, there is formed a pixel portion 'P' comprising the first electrode 52, the light emitting portion 56, and the second electrode 58.

There is formed a connection electrode 'C1' comprising the connection electrode insulating layer 54, the spacer 'S', and a conductive layer electrically connected with the second electrode 58.

Figure 10:
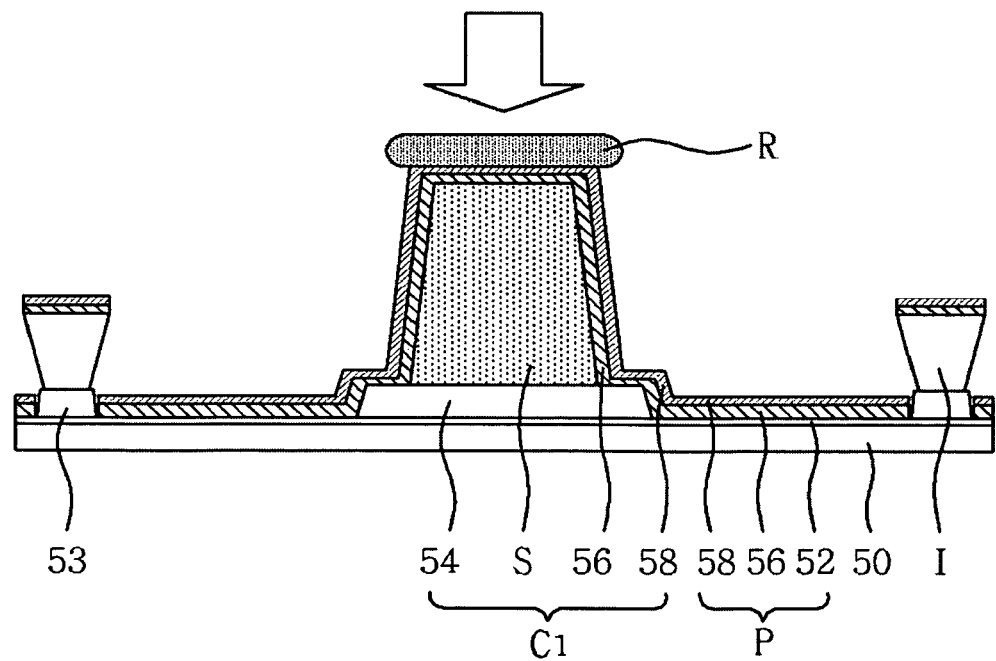
Figure 11:
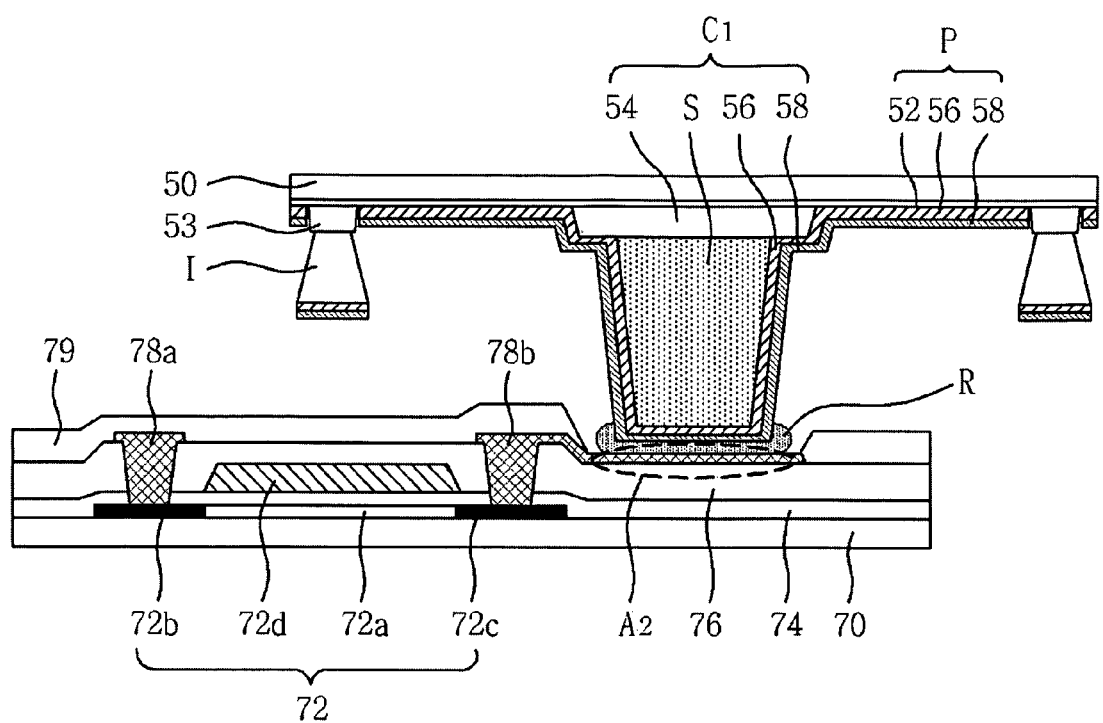

Referring to FIGS. 10 and 11, on a connection electrode 'C1' formed by the steps of forming an electrical contact portion and attaching the substrates is formed a paste-type electrical contact portion 'R' having conductivity, viscosity, and thermal resistance and comprising any one of Ag, Cu, or Au as its main base material.

For example, the electrical contact portion 'R' may be formed on connection electrode by printing, as the first substrate 50 is transferred under the connection electrode and the paste-type electrical contact portion 'R', sticked on the roller, is contacted.

Then, the first and second substrates 50, 70 are attached to each other such that the connection electrode 'C1' on the first substrate 50 and the connection electrode 'C1' on the second substrate 70 correspond to each other in the contact region A2, and are electrically connected with each other through the electrical contact portion 'R'. In addition, the application of specific light or heat on the electrical contact portion 'R' cures the electrical contact portion 'R', thus completing the light emitting device.

The light emitting device having the above structure according to various embodiments of the present invention may attain the objectives of the present invention by improving electrical contact structure of the prior connection electrode.

Although the present invention has been described with respect of a case where the light emitting portion is formed only on the first substrate, it is not limited thereto, and accordingly, the light emitting portion may be optionally formed on the second substrate.

It should be understood that the light emitting device of the present invention may apply either or both of an organic material and an inorganic material on the light emitting portion.

According to the present invention, in a connection electrode structure of a light emitting device, a paste-type electrical contact portion having conductivity, viscosity, and thermal resistance improves the electrical connect degree of the first and second substrates, thus making it possible to solve the problem of loose contact of the connection electrode due to process error, floating, and driving heat.

Therefore, the present invention may improve process throughput, product lifespan, and reliability.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light emitting device comprising:
   a first pixel portion that comprises a light emitting portion arranged between two electrodes formed on a first substrate;
   a transistor portion formed on a second substrate arranged to be opposed to the first substrate;
   a passivation layer covering the transistor portion;
   a first connection electrode including a first spacer and a first conductive layer extended from either of the two electrodes to cover the first spacer so that the first connection electrode is protruded from the first substrate to the second substrate;
   a second connection electrode including a second spacer formed on the passivation layer and a second conductive layer extended from a drain of the transistor portion to cover all portions of the second spacer so that the second connection electrode is protruded from the second substrate to the first substrate; and
   an electrical contact material in surface contact with both the first connection electrode and the second connection electrode, wherein the electrical contact material is formed only within the contacting area between the first connection electrode and the second connection electrode.

2. The light emitting device of claim 1, further comprising:
   a second pixel portion that comprises a light emitting portion arranged between two electrodes on a region adjacent to the transistor portion on the second substrate, wherein either of the two electrodes is electrically connected with the transistor portion.

3. The light emitting device of claim 2, wherein the light emitting portion of the second pixel portion comprises an organic or inorganic light emitting layer.

4. The light emitting device of claim 1, wherein the electrical contact material comprises a paste of any one of Ag, Cu, or Au.

5. The light emitting device of claim 1, wherein the electrical contact material comprises a paste of an alloy of at least two of Ag, Cu, or Au.

6. The light emitting device of claim 1, wherein the light emitting portion of the first pixel portion comprises an organic or inorganic light emitting layer.

* * * * *